United States Patent
DCamp et al.

(10) Patent No.: US 7,037,805 B2
(45) Date of Patent: May 2, 2006

(54) METHODS AND APPARATUS FOR ATTACHING A DIE TO A SUBSTRATE

(75) Inventors: Jon B. DCamp, Savage, MN (US); Harlan L. Curtis, Champlin, MN (US); Lori A. Dunaway, New Hope, MN (US); Max C. Glenn, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/878,845

(22) Filed: Jun. 28, 2004

(65) Prior Publication Data

US 2004/0232455 A1  Nov. 25, 2004

Related U.S. Application Data

(63) Continuation-in-part of application No. 10/431,420, filed on May 7, 2003, now Pat. No. 6,927,098.

(51) Int. Cl.
*H01L 21/30* (2006.01)
*H01L 21/46* (2006.01)

(52) U.S. Cl. .................. 438/455; 438/121; 438/126; 438/456

(58) Field of Classification Search ............. 438/121, 438/126, 455, 456
See application file for complete search history.

(56) References Cited

U.S. PATENT DOCUMENTS

| 4,987,673 | A | 1/1991 | Kogura et al. |
|---|---|---|---|
| 5,743,005 | A | 4/1998 | Nakao et al. |
| 5,864,943 | A | 2/1999 | Arakawa et al. |
| 5,992,013 | A | 11/1999 | Morita |
| 6,238,938 | B1 * | 5/2001 | Smith ................... 438/10 |
| 6,294,408 | B1 * | 9/2001 | Edwards et al. ......... 438/121 |
| 6,316,840 | B1 | 11/2001 | Otani |
| 6,388,203 | B1 | 5/2002 | Rinne et al. |
| 6,459,150 | B1 | 10/2002 | Wu et al. |
| 6,500,760 | B1 | 12/2002 | Peterson et al. |
| 6,519,075 | B1 | 2/2003 | Carr et al. |
| 6,536,653 | B1 | 3/2003 | Wang et al. |
| 6,550,337 | B1 | 4/2003 | Wagner et al. |
| 6,640,423 | B1 | 11/2003 | Johnson et al. |
| 2001/0027606 | A1 | 10/2001 | Ohkubo et al. |
| 2002/0069952 | A1 | 6/2002 | Kurosawa |
| 2002/0089836 | A1 * | 7/2002 | Ishida et al. ........... 361/824 |

(Continued)

FOREIGN PATENT DOCUMENTS

EP         1157967        11/2001

(Continued)

OTHER PUBLICATIONS

Schmidt, "Wafer-to-Wafer Bonding for Microstructure Formation," Invited Paper, Proceedings of the IEEE, vol. 86, No. 8, pp. 1575-1583, Aug. 1998.

(Continued)

*Primary Examiner*—Ngân V. Ngô
(74) *Attorney, Agent, or Firm*—Honeywell International (57) ABSTRACT

A method for increasing the bonding strength between a die and a housing for the die is described where a micro-electromechanical system (MEMS) device is formed on the die. The method includes depositing a plurality of contacts of bonding material between the substrate and die, and forming a bond between the die and the housing by applying at least 25,000 kilograms of force per gram of bonding material to the housing, the contacts, and the die.

61 Claims, 8 Drawing Sheets

U.S. PATENT DOCUMENTS

| | | |
|---|---|---|
| 2002/0185715 A1 | 12/2002 | Honer et al. |
| 2003/0075792 A1 | 4/2003 | Ruhland |
| 2003/0095343 A1 | 5/2003 | Feldman et al. |
| 2003/0122243 A1 | 7/2003 | Lee et al. |
| 2003/0122244 A1 | 7/2003 | Lin et al. |
| 2003/0122246 A1 | 7/2003 | Lin et al. |
| 2003/0124767 A1 | 7/2003 | Lee et al. |
| 2003/0124835 A1 | 7/2003 | Lin et al. |
| 2003/0160021 A1 | 8/2003 | Platt et al. |
| 2003/0230798 A1 | 12/2003 | Lin et al. |
| 2004/0066258 A1 | 4/2004 | Cohn et al. |
| 2004/0229418 A1* | 11/2004 | Hashimoto ................. 438/198 |
| 2004/0232540 A1* | 11/2004 | Hashimoto ................. 257/692 |
| 2004/0262754 A1* | 12/2004 | Khan et al. ................. 257/734 |
| 2005/0181543 A1* | 8/2005 | Lee et al. ................... 438/127 |

FOREIGN PATENT DOCUMENTS

| | | |
|---|---|---|
| JP | 01004473 | 1/2001 |
| WO | WO 0150106 | 7/2001 |
| WO | WO 02064497 | 8/2002 |

OTHER PUBLICATIONS

U.S Appl. No. 10/431,420, "Methods and Apparatus for Attaching MEMS Devices to Housing," filed May 7, 2003.

* cited by examiner

METHODS AND APPARATUS FOR ATTACHING A DIE TO A SUBSTRATE

This application is a continuation-in-part application of U.S. patent application Ser. No. 10/431,420 filed 7 May 2003, now U.S. Pat. No. 6,927,098 and which is incorporated herein by reference.

GOVERNMENT CONTRACT

This invention was supported under United States Government Contract No. F33615-01-3-5705. The government may have certain rights in this invention.

BACKGROUND

This invention generally relates to device packaging, and more particularly, to die packaging.

Many electrical, optical and electromechanical systems include a collection of interconnected component parts. Some of the component parts are housed in a package of some sort for protection. The package typically includes one or more electrical leads extending from electrical pads on the component part to an outer surface of the package. The individual packages are commonly secured to a circuit board or the like, and the circuit board typically has electrical traces that interconnect the electrical leads of the various packages to form the system or part of the system.

In some applications, such as high gravitational force (High-G) applications, it can be important that the component parts remain securely held within their package. If the component part disengages from the package, the component part and possibly the system may fail to function. In some cases, the component part may include a die that includes electrical and/or mechanical functions. For example, the component part may be an integrated circuit die that includes logic for processing one or more electrical signals. Alternatively, or in addition, the component part may include a Micro-Electromechanical System (MEMS) die, such as a gyroscope and/or accelerometer die. Especially in high-G applications, the bond strength between the component part die and the corresponding package or substrate can be important to system reliability.

SUMMARY

The present invention generally relates to device packaging, and more particularly, to methods and apparatus for providing improved bond strength between a die and a corresponding device package or substrate.

In one illustrative embodiment, a die is provided that includes one or more bonding regions, wherein each bonding region includes a metallic or other bonding surface. A substrate, such as an internal or bottom wall of a package cavity, is adapted to have one or more bonding regions that also have a metallic or other bonding surface. The one or more bonding regions of the substrate are arranged to be in registration with the one or more bonding regions of the die when the die is properly aligned with the substrate.

A bonding material is provided on at least selected bonding regions of the die and/or substrate. A cumulative amount of bonding material is provided to bond the die to the substrate, and is distributed evenly or unevenly amongst the selected bonding regions. The die is then aligned with the substrate so that the one or more bonding regions of the die are in registration with the one or more bonding regions of the substrate. Then, a force is applied between the die and substrate, where the force is at least 25000 Kg of force per cumulative gram of bonding material. The bonding regions may also be heated while the force is applied. It has been found that by using this method, the bond strength between the die and the substrate may be significantly increased relative to conventional thermo-compression bonding techniques that use lower forces.

In another illustrative embodiment, a bonding material is provided on at least selected bonding regions of the die and/or substrate. The bonding material may have a minimum lateral dimension as applied. The die is then aligned with the substrate so that the one or more bonding regions of the die are in registration with the one or more bonding regions of the substrate. A force is then applied between the die and substrate such that the minimum lateral dimension in at least selected bonding regions increases by at least 40%.

In yet another illustrative embodiment, a bonding material is provided on at least selected bonding regions of the die and/or substrate. A cumulative amount of bonding material is provided to bond the die to the substrate, and is distributed evenly or unevenly amongst the selected bonding regions. The die is then aligned with the substrate so that the one or more bonding regions of the die are in registration with the one or more bonding regions of the substrate. The one or more bonding regions are then heated to a temperature, and a force is applied between the die and substrate, such that when the bond is completed at least 75,000 kg of force per gram of cumulative bonding material is required to pull the die from the substrate.

An illustrate pick and place tool to help perform the above methods may include a shaft portion with a tapered proximal end and a head portion connected to the shaft portion. The head portion may have a distal end and a die cavity located at the distal end. A lumen may extend from the die cavity through the shaft portion for providing a vacuum to the die cavity. The vacuum may help secure the die in the die cavity during pick and placement of the die. The pick and place tool may also be constructed to handle the forces discussed above.

DETAILED DESCRIPTION

Figure 1:
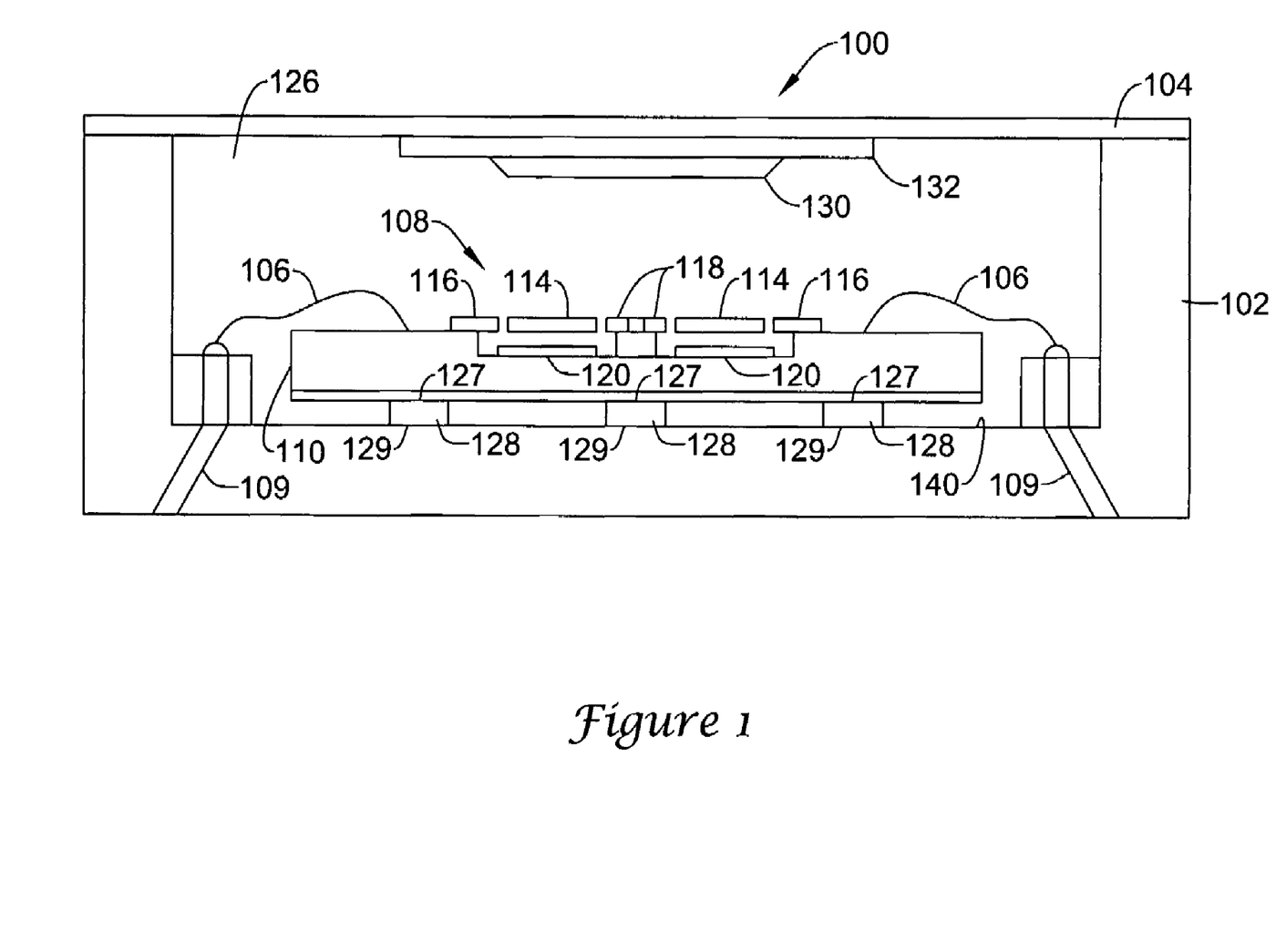
FIG. 1 is a side view of a MEMS device positioned in a package.

FIG. 1 is a diagram of a Micro-Electromechanical System (MEMS) die 110 placed in a housing or package 102. In the illustrative embodiment, the MEMS die 110 is a tuning fork gyroscope. The tuning fork gyroscope may include a micro-machine 108 that includes proof masses 114, motor drive combs 116, and motor pick-off combs 118. Micro-machine 108 may further include sense plates 120, which form parallel plate capacitors with proof masses 114. In one embodiment, sense plates 120 are metal films that have been deposited and patterned onto MEMS die 110.

While a MEMS die 110 is used as an example, any suitable die may be used. For example, the MEMS die 110 may be an integrated circuit die that does, or does not, include any MEMS components, if desired.

MEMS die 110 is shown positioned in housing or package 102 (e.g. a chip carrier), to which a cover 104 may eventually be attached in order to form a sealed cavity. In the illustrative embodiment, electrical leads 106, such as bond wires, are used to provide electrical connections from the MEMS die 110 to pads on the package 102. Alternatively, or in addition, bump bonds (not shown) may be used to attach the MEMS die 110 to the package 102, and to provide electrical connections from the MEMS die 110 to pads on the package 102, if desired. In the illustrative embodiment of FIG. 1, electrical connections 109 are provided through package 102 to bond pads or lead wires (not shown) on the exterior of the package.

The MEMS die 110 may include one or more bonding regions. In the illustrative embodiment, the one or more bonding regions includes a layer 127 of gold disposed on the back side of the MEMS die 110. The bottom wall 140 of the package 102 also includes one or more bonding regions 129 that are arranged to be in registration with the one or more bonding regions of the MEMS die 110 when the MEMS die 110 is properly aligned with the substrate. The one or more bonding regions 129 may also include a layer of metallic material, such as gold.

A bonding material 128, such as gold, is provided on at least selected bonding regions of the MEMS die 110 and/or package 102. A cumulative amount of bonding material is provided to bond the MEMS die 110 to the package 102, and is distributed evenly or unevenly amongst the selected bonding regions. The MEMS die 110 is then aligned with the substrate so that the one or more bonding regions of the MEMS die 110 are in registration with the one or more bonding regions 129 of the package 102. Then, and as further described below, a force and heat are applied between the MEMS die 110 and the package 102. In one illustrative embodiment, the force is at least 25000 Kg of force per cumulative gram of bonding material 128, and the bonding material is heated to at least 300 degrees Celsius.

Alternatively, or in addition, the bonding material 128 may have a minimum lateral dimension as applied, and a force and heat are applied between the MEMS die 110 and the package 102 such that the minimum lateral dimension in at least selected bonding regions increases by at least 40%. Alternatively, or in addition, sufficient force and heat are applied such that, when the bond is completed, at least 75,000 kg of force per gram of cumulative bonding material is required to pull the die from the substrate.

Figure 2A:
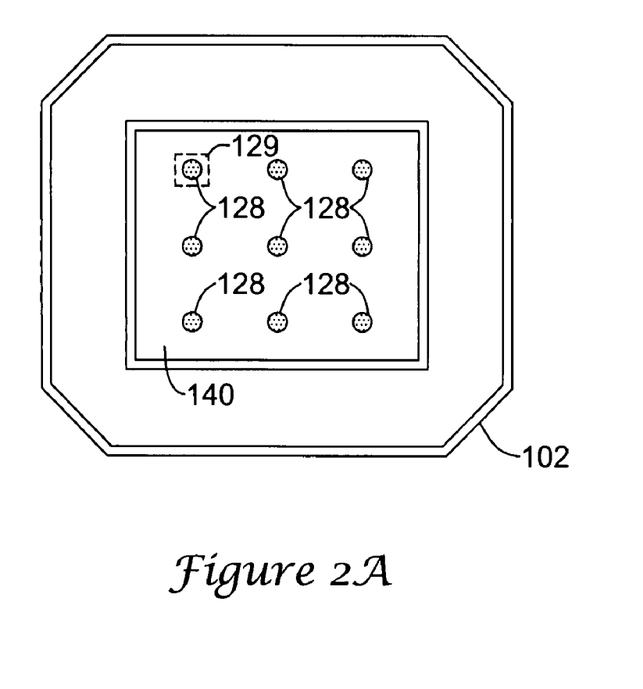
FIGS. 2A and 2B are top views of a MEMS device housing showing bonding material sites for a die.
Figure 2B:
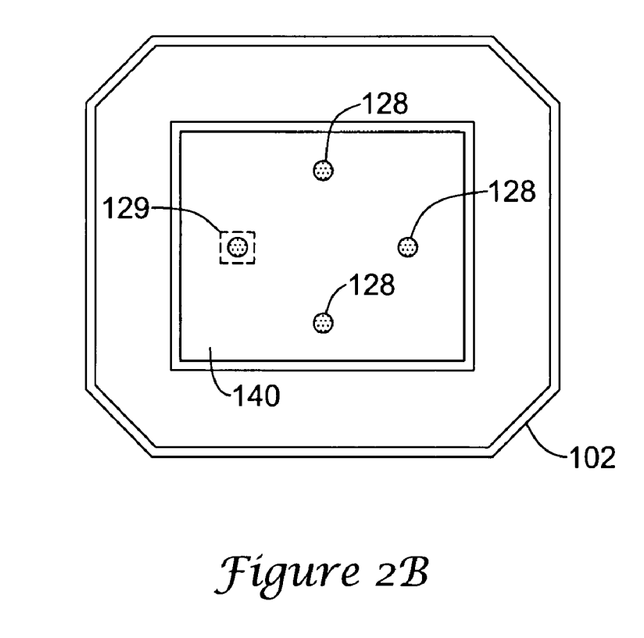

FIGS. 2A and 2B are top views of package or housing 102 with die 110 and cover 104 removed. FIGS. 2A and 2B show a number of spaced bonding material 128 sites placed on a bottom surface 140 of housing 102 before die 110 is attached to housing 102. In the illustrative embodiment shown in FIG. 2A, nine bonding material sites 128 are applied on the bottom surface 140, with each placed on one of the bonding regions 129 of the package 102. In the illustrative embodiment shown in FIG. 2B, four bonding material sites 128 are applied on the bottom surface 140, with each placed on one of the bonding regions 129 of the package 102.

Figure 3A:
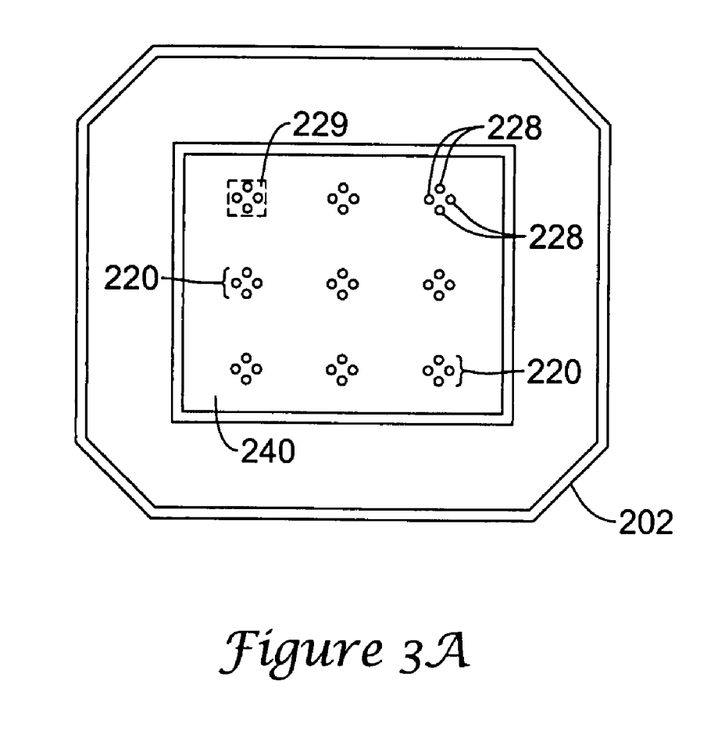
FIGS. 3A and 3B are top views of a MEMS device housing showing clustered bonding material sites for attaching a die to the housing.
Figure 3B:
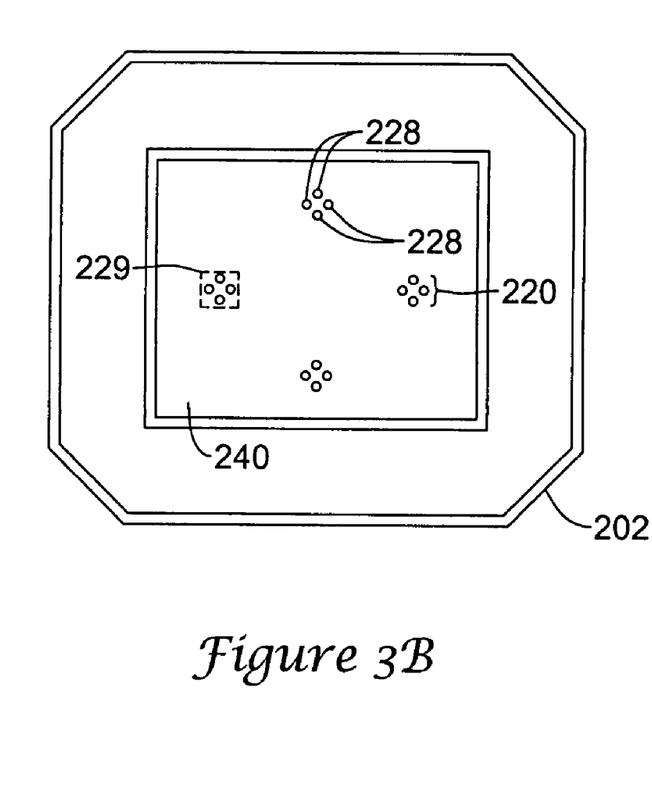

FIGS. 3A and 3B are top views of a package 202, similar to housing 102 (shown in FIGS. 2A and 2B), except that package 202 includes clusters 220 of bonding material sites 228 on the bottom surface 240 of housing 202. In the illustrative embodiment shown in FIG. 3A, each one of the clusters 220 corresponds to one of the bonding material sites 128 of FIG. 2A, where each cluster 220 has four bonding material sites 228, although fewer or more bonding material sites may be used, as desired. For example, each of the clusters can include two, three, four, five, or six or more bonding material sites 228. In the embodiment shown in FIG. 3A, nine clusters 220 of bonding material sites 228 are deposited onto bottom surface 240 of package 202. In the illustrative embodiment shown in FIG. 3B, each one of the clusters 220 corresponds to one of the bonding material sites 128 of FIG. 2B, where each cluster 220 has four bonding material sites 228, although fewer or more bonding material sites may be used, as desired. For example, each of the clusters can include two, three, four, five, or six or more bonding material sites 228. In the embodiment shown in FIG. 3B, four clusters 220 of bonding material sites 228 are deposited onto bottom surface 240 of package 202.

By incorporating clusters 220 of bonding material sites 228, it is believed that a greater surface area of die 110 may be in contact with bonding material sites 228, which as further described below, may result in a stronger bond between die 110 and housing 202.

Figure 4:
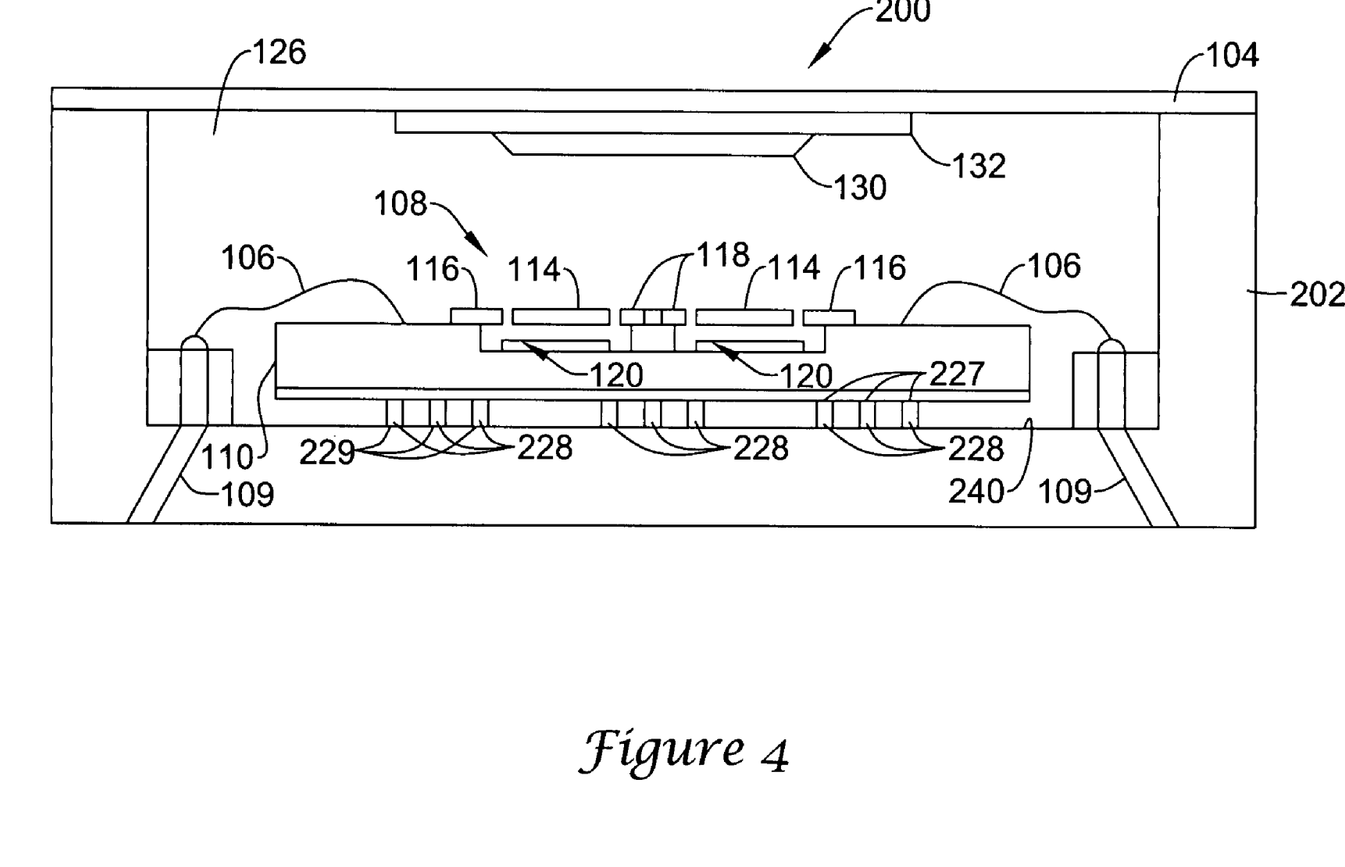
FIG. 4 is a side view of a MEMS device which utilizes clustered bonding material sites.

FIG. 4 illustrates a side view of an embodiment of a MEMS device 200 which incorporates clustered bonding material sites 228 as described with respect to FIG. 3. As compared to a single bonding material site 128, clusters of bonding material sites 228 provide the attachment mechanism for forming thermocompression bonds with a die, while distributing the bond area over more of the die surface, which allows the die to better withstand the pressures utilized in thermocompression bonding as compared to known attachment methods. The higher pressures result in stronger thermocompression bonds with the die than the bonds that are formed in utilizing the known attachment methods. The stronger bonds are sufficiently strong enough to allow operation of a MEMS device on a die that operates in a high-G environment. In addition, the larger surface area of contact can also help to prevent damage to the die.

As described above, the bonding material sites 228 are formed from a bonding material such as a metal and are placed in contact with a die bonding region 227 and a housing bonding region 229. The die bonding region 227 and a housing bonding region 229 can include a metallic surface, as described below.

MEMS devices 100 and 200 may comprise more or fewer components than described. For instance, while two electrical contacts 106 are illustrated, those skilled in the art will recognize that a MEMS device may comprise more than two contacts and/or extruding pins as well. Additionally, more or fewer members may be present in MEMS devices 100 and 200 other than those components above described. Further, components of MEMS devices 100 and 200 may comprise multiple functions. Micro-machine 110 may be any such electromechanical machine used in accordance with MEMS and MEMS based devices. In addition, alternate packages may be used as well to provide a housing for MEMS 100 and 200. The illustrations in the Figures are intended to show embodiments for attaching a MEMS device within a housing utilizing contacts 128 or clustered contacts 228 rather than provide a description of a specific MEMS device.

Figure 5:
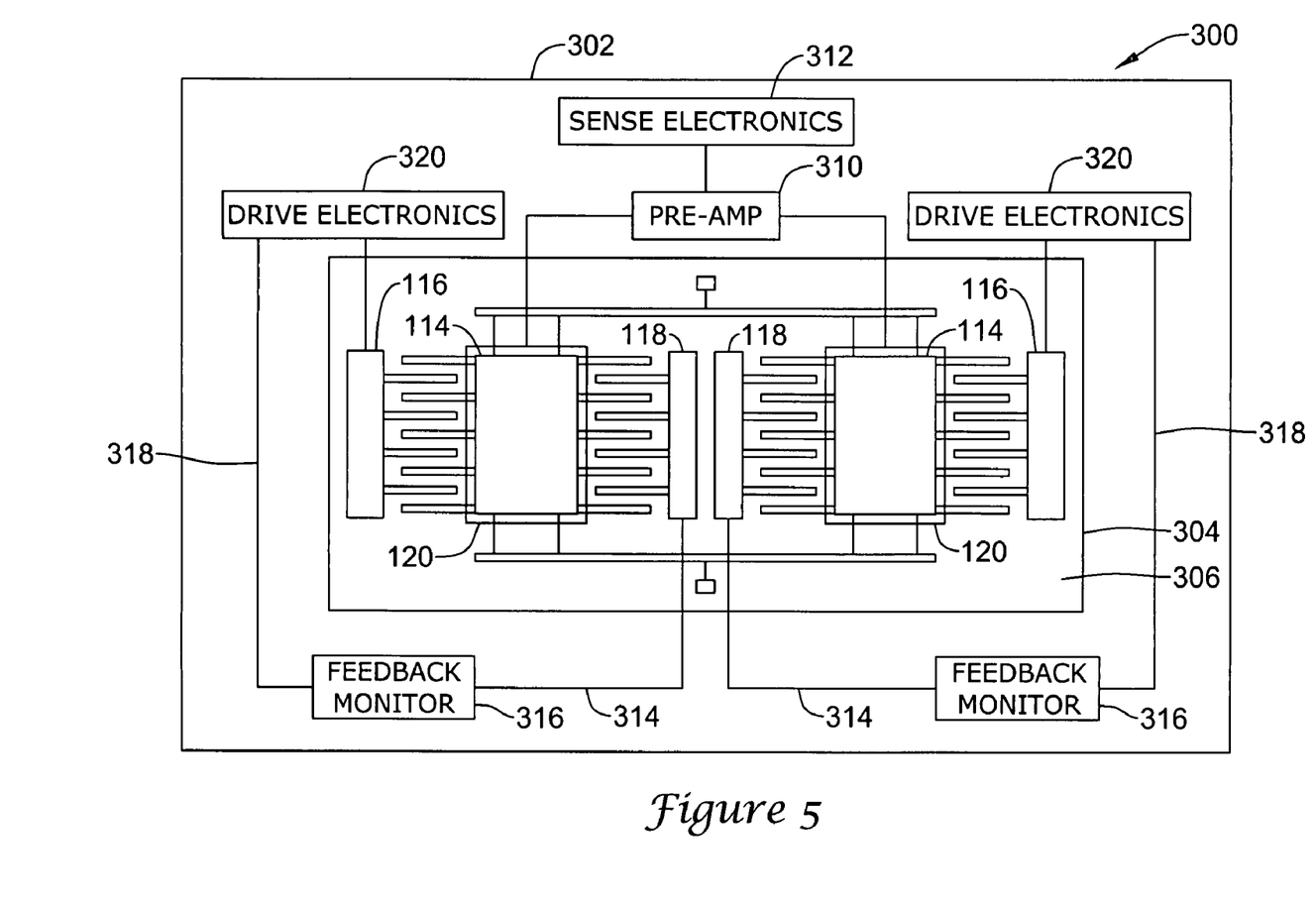
FIG. 5 is a schematic view of a MEMS gyroscope which can be produced utilizing the clustered bonding material sites and housing of FIGS. 3 and 4.

FIG. 5 is a schematic illustration of MEMS gyroscope 300 configured to incorporate clustered bonding material sites 228 (shown in FIGS. 3 and 4) to attach die 110 (shown in FIG. 4) to a housing through thermocompression bonding. In one embodiment, MEMS gyroscope 300 includes housing 302 that includes therein, for example, a tuning fork gyroscope (TFG) 304 on die 110 (shown in FIG. 4). Housing 302 is configured to be sealed with cover 104 (shown in FIG. 4). Housing 302 is typically one of a plastic package, a small outline integrated circuit (SOIC) package, a ceramic leadless chip carrier (CLCC), a plastic leaded chip carrier (PLCC) package, a quad flat package (QFP), or other housings as known in the art. Housing 302 provides a structure to co-locate elements of TFG 304 and/or locate other elements within a close proximity of one another within the housing 302. TFG 304, in one embodiment, is located within a substantially sealed cavity 306 which is formed by bonding cover 104 to housing 302. Another illustrative housing is a controlled collapse chip connection (C4) also known as a "flip-chip". A flip-chip forms a device attachment with circuitry facing the substrate and solder bumps deposited through a bump mask onto wettable chip pads that generally connect to matching wettable substrate pads. Flip-chips can be aligned to corresponding substrate metal patterns.

In one embodiment, TFG 304 includes proof masses 114, motor drive combs 116, motor pick-off combs 118, and sense plates 120 constructed from a wafer. A pre-amplifier 310 is included within housing 302 and is electrically connected or coupled to each proof mass 114 and sense plate 120 combination. In one embodiment, pre-amplifier 310 and TFG 304 are formed on a common substrate (e.g. die 110) and, in one embodiment, are electrically connected. In other embodiments, pre-amplifier 310 is electrically connected to proof masses 114. An output of pre-amplifier 310 is sent to sense electronics 312, or alternatively, pre-amplifier 310 is incorporated within sense electronics 312.

In addition, an output 314 of motor pick-off combs 118 is transferred to feedback monitors 316. Feedback monitors 316 provide output signals 318 to drive electronics 320, which power motor drive combs 116. Alternatively, feedback monitors 316 are incorporated within drive electronics 320. MEMS gyroscope 300 also includes a system power source and other operational electronics, which are not shown in FIG. 5 for ease of illustration.

Motor drive combs 116 excite the proof masses 114 using electrostatic forces by applying a voltage to electrodes of proof masses 114. Motor pick-off combs 118 monitor the excitation or oscillation of proof masses 114 by monitoring voltage signals on electrodes on proof masses 114. Motor pick-off combs 118 output a feedback signal to feedback monitors 316. Feedback monitor 316 provides an output 318 which is input to drive electronics 320. If proof masses 114 begin to oscillate too fast or too slow, drive electronics 320 may adjust an oscillation frequency such that proof masses 114 vibrate at a resonant frequency. Excitation at such a frequency may enable a higher amplitude output signal to be generated.

As above described, incorporation of clustered bonding material sites 228 (shown in FIGS. 3 and 4) provide additional surface area and support when attaching a die, for example, die 110 (shown in FIG. 4) to housing 102 utilizing a thermocompression process. In certain embodiments, clustered bonding material sites 228 provide two or more times as many contact points for attaching a die as compared to attachment methods utilizing a single bonding material site 128 (shown in FIGS. 1 and 2).

Utilization of clustered bonding material sites 228, provides the advantages of thermocompression bonding techniques as known, while also providing a stronger bond between the dies and housings than is provided through utilization of a single bond material site. Clustered bonding material sites are further usable in other sensor based-devices, including sensor devices where the micro-machine is oriented within a housing with an orientation that is upside down as compared as compared to known mounting orientations. It is also contemplated to utilize the clustered bonding material sites attachment methods described herein in a variety of MEMS devices, including, but not limited to, MEMS inertial measurement units, gyroscopes, pressure sensors, temperature sensors, resonators, air flow sensors, and accelerometers.

Figure 6:
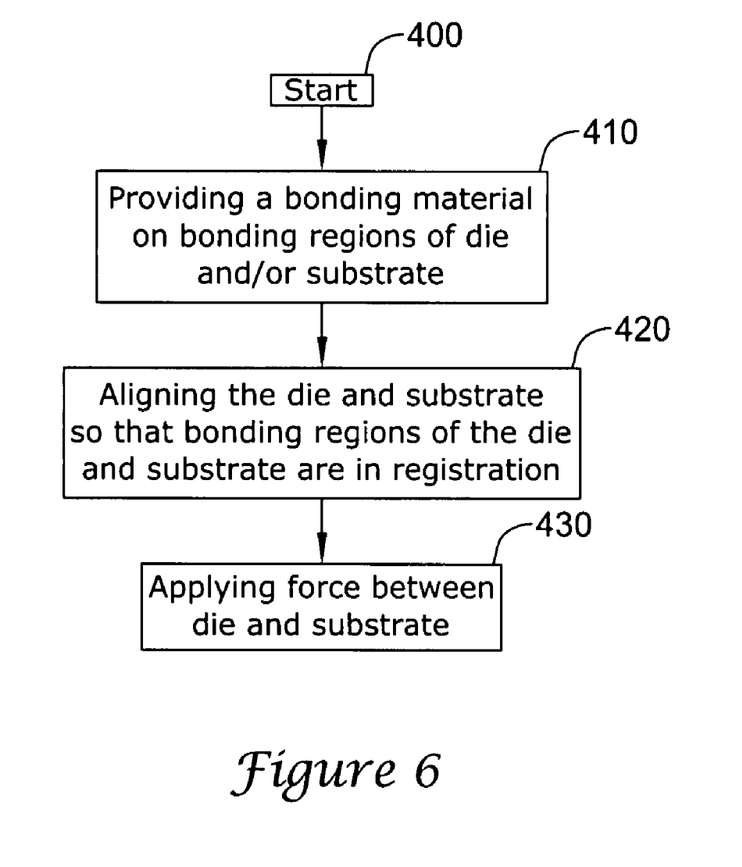
FIG. 6 is a flow diagram of an exemplary method of bonding a die to a housing.
Figure 7:
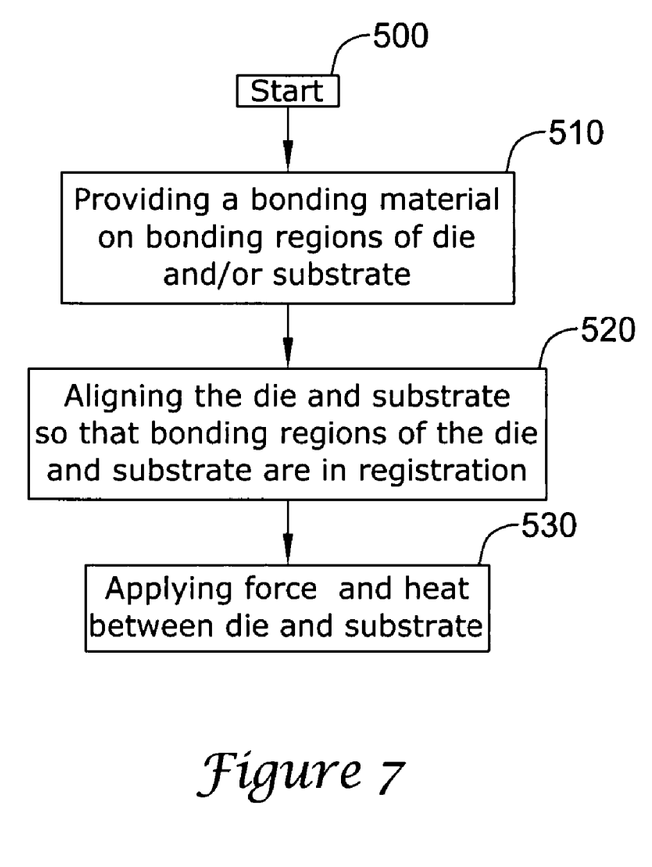
FIG. 7 is a flow diagram of an exemplary method of bonding a die to a housing.

FIG. 6 and FIG. 7 illustrate thermocompression methods that provide enhanced bond strength as compared to prior thermocompression methods. Using the inventive thermocompression method described herein provides an enhanced bonding of die to housing whether or not the contacts are arranged in a cluster arrangement. The methods begin at the start block 400, 500 and proceeds to providing a die and substrate can include a plurality of bonding regions that include a metallic surface, at block 410, 510. Next, the die and substrate can be aligned such that selected bonding regions on the die can be placed in registration with selected bonding regions on the substrate, at block 420, 520. A bonding material can be placed on at least selected bonding regions on the die and/or substrate, resulting in a cumulative amount of bonding material used for bonding the die to the substrate. Then, a force is applied between the die and substrate, at block 430. The force is sufficient to bond the die to the substrate. In addition, the bond material can also be heated while force is applied to bond the die to the substrate, as shown in block 530.

The die and substrate bond regions can include a metallic surface. The metallic surface can include any useable metal such as, for example, gold, silver, lead, tin, aluminum, or the like. One useful metallic surface is gold. Another useful metallic surface is aluminum. In some embodiments the bond regions and bonding material is formed of a single material such as either gold or aluminum. In other embodiments, the bond regions and bonding materials is formed of different materials. The die and substrate can have the same or different number of bond regions. Any number of bond regions can be used, as desired. For example, at least 5, or at least 10, or at least 15, or at least 20, or 5 to 20 bond regions can be used. As described above, the substrate can also be referred to as a housing. Bond material is placed on at least selected bonding regions on the die and/or substrate, resulting in a cumulative amount of bonding material used for bonding the die to the substrate. The bond material is disposed on the bonding regions via known techniques.

The bond material can be formed of any useful metal or alloy. The bond material can be such as, for example, gold, silver, lead, tin, aluminum, or the like. The bond material and metallic surface of the bond region for both the die and substrate can be the same material. One useful bond material is gold. Another useful bond material is aluminum. The cumulative amount of bonding material used for bonding the die to the substrate can be any useful amount such as, for example, less than 0.001 gram, or less than 0.0001 gram, or less than 0.00005 gram. The bond material applied to the bonding region, in at least selected bonding regions, can have a minimum lateral dimension prior to applying force during the bonding process. Bonding material placed in at least selected bonding regions can also be referred to as "bumps".

Figure 8:
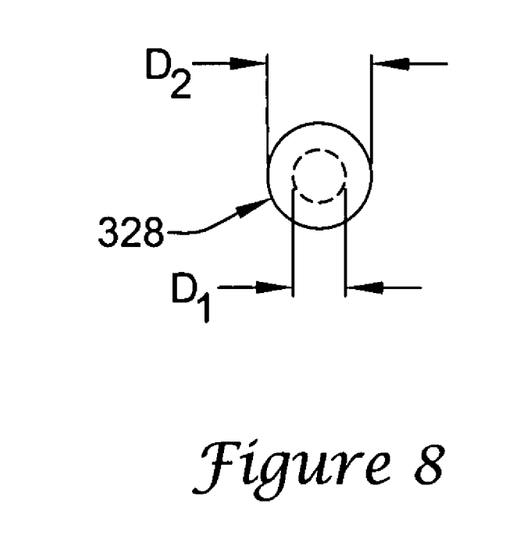
FIG. 8 is a top view of a bonding material bump.
Figure 9:
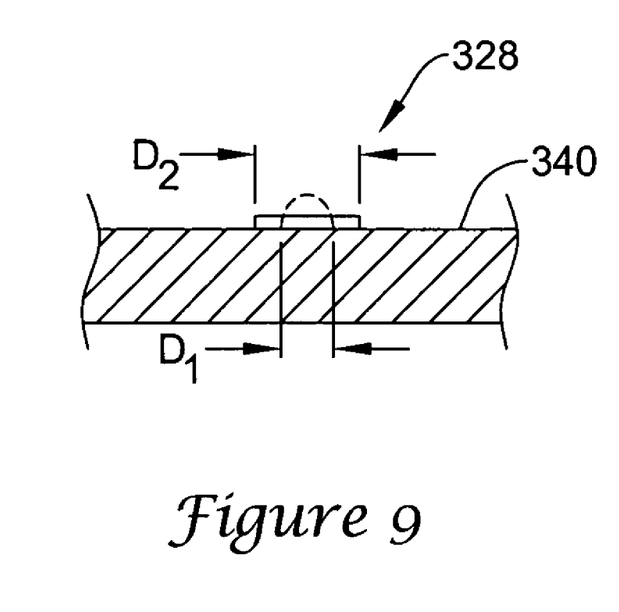
FIG. 9 is a cross-sectional view of a bonding material bump.

FIG. 8 is a top view of a bonding material bump 328 and FIG. 9 is a cross-sectional view of a bonding material bump 328 disposed on a bottom wall 340. The bump 328 can have an initial diameter $D_1$. After force has been applied to the bump 328, the bump 328 can have a final diameter $D_2$. Once force has been applied, the bonding material lateral dimension can be increased by at least 40%, or at least 50%, or at least 60%, or at least 70%, or at least 80%, or at least 90%, or at least 100%, or at least 200%, or at least 300%, or in a range of 40 to 300%, or in a range of 40 to 200%, or in a range of 75 to 150%. The lateral dimension of the bonding material within at least selected bonding regions prior to applying force during the bonding process can be, for example, less than 10 mil, or less than 5 mil, or less than 3 mil. The bump 328 is shown as initially having a generally uniform shape, however the bump 328 can have an irregular shape, as desired.

Once the bond material is placed in at least selected bonding regions and at least selected bonding regions on the die are aligned in registration with selected bonding regions on the substrate, a bonding force can be applied between the die and substrate sufficient to secure the die to the substrate. This bonding force can be any useful amount and can be an amount that is greater than forces that have been previously used in this technology. The bonding force can be, for example, at least 25,000 kg force, or 50,000 kg force, or 100,000 kg force per cumulative gram of bonding material as described above.

Once the bond material is placed in at least selected bonding regions and at least selected bonding regions on the die are aligned in registration with selected bonding regions on the substrate, a heat can be applied to the bonding material sufficient to aid in securing the die to the substrate. This heat can be any useful amount sufficient to raise the temperature of the bonding material to a temperature greater than 300, 350, 450, or 500 degrees C.

Once the die and substrate is bonded with the method described above, the bond strength is increased over prior thermocompression bonds. The bond strength can be measured by any useful technique. One useful measurement technique is a die pull test, described in the examples below. Bonds formed by the inventive thermocompression method can have a bond strength of at least 75,000 kg, or at least 85,000 kg, or at least 95,000 kg, or at least 100,000 kg of force per gram of cumulative bonding material being required before the bond fails or before the die separates from the substrate.

The bond strength of the die to the substrate can be measured as is known in the art. For example, one model of a die pull tester is a Chatillon Digital Force Gauge Model No. DFIS10 manufactured by Ametek Inc., (Largo, Fla.). This bond strength tester provides a digital readout of peak kg of force required before die to substrate bond failure.

Figure 10:
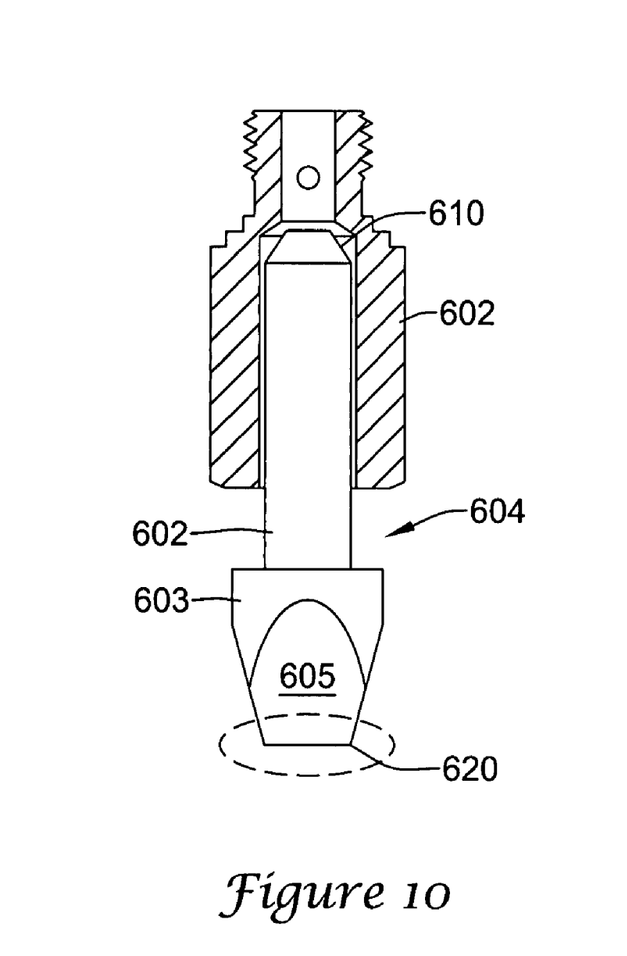
FIG. 10 is a side view of an illustrative pick and place tool used in an exemplary method of bonding a die to a housing.
Figure 11:
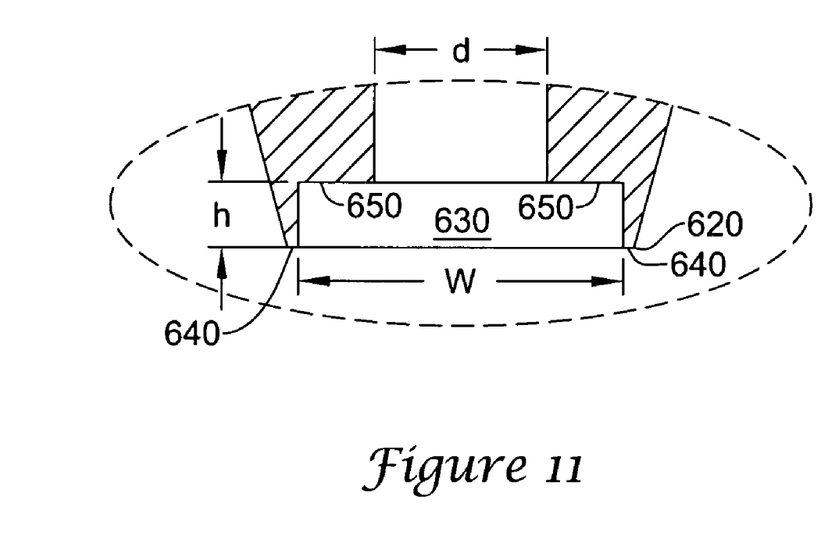
FIG. 11 is a cross-sectional view of the distal end of the tool shown in FIG. 10.

FIG. 10 is a side view of an illustrative pick and place tool used in an exemplary method of bonding a die to a housing. FIG. 11 is a cross-sectional view of the distal end of the tool. The tool 604 is shown in engagement with a tool holder 602. The tool holder 602 is connected to a pick and place system (not shown) capable of applying the force required to create the thermocompression bond described herein. The tool 604 includes a shaft portion 602 and a head portion 603. The tool can be made of any useful material such as, for example, a metal.

The shaft portion 602 can include a proximal end 610 that is tapered. The shaft 602 can have any cross-sectional shape such as, for example, a round cross-sectional shape. The taper can be used to "self-level" the tool 602 and provide an accurate placement of the die on the substrate. For example, the tool can provide a repeatable bonding of a die to a substrate having a planar accuracy (accuracy for the angles around X and Y for planarity) of better than 0.5 degrees. The tool 604 can be coupled to the tool holder by any method such as, for example, set screws (not shown). In one illustrative embodiment, the shaft portion 602 can have a length of 0.5 inch. The outer diameter of the shaft can be any useful diameter such as, for example, 0.125 inch. The proximal end 610 can taper down to a diameter of 0.07 inch, as desired. The taper can be any useful angle such as, for example, 30 degrees. An inner vacuum lumen can extend through the shaft 602 and head 603 to allow a vacuum to hold a die in place when the die is being picked and placed onto the substrate for bonding.

The head portion 603 is attached to the shaft portion 602 and can include a distal end 620 that can be tapered. The distal end 603 can be tapered on four opposing sides 605 forming a square or rectangle cross-sectional shape and having a cavity 630 of sufficient size to enclose at least a portion of a die that is to be picked and placed onto the substrate for bonding. In one illustrative embodiment, the head portion 603 can have a length of 0.25 inch. In an illustrative embodiment, the cavity 630 can have a width (w) of 0.12 inch, a length (not shown) of 0.1 inch and a height (h) of 0.03 inch. The distal end 603 can further include a distal edge 640 defining a perimeter around the cavity 630. In some embodiments, the cavity 630 has a die engagement surface 650 that applies the force uniformly to the die during the bonding step. In some embodiments, the die engagement surface 650 is configured to that it cannot come into contact with the silicon structures located on the die surface.

While the invention has been described in terms of various specific illustrative embodiments, those skilled in the art will recognize that the invention can be practiced with modification within the spirit and scope of the claims

What is claimed is:

1. A method for bonding a die to a substrate, wherein the die includes one or more bonding regions each including a metallic surface, and wherein the substrate includes one or more bonding regions each including a metallic surface, the one or more bonding regions of the die being in registration with the one or more bonding regions of the substrate when the die is aligned with the substrate, the method comprising:
   providing a bonding material on at least selected bonding regions of the die and/or substrate, resulting in a cumulative amount of bonding material used for bonding the die to the substrate;
   aligning the die and/or substrate so that the one or more bonding regions of the die are in registration with the one or more bonding regions of the substrate; and
   applying a force between the die and substrate, wherein the force is at least 25000 Kg of force per cumulative gram of bonding material.

2. A method according to claim 1 further comprising the step of applying heat to the die and/or substrate while applying the force between the die and the substrate.

3. A method according to claim 2 wherein the heat applying step includes applying sufficient heat to raise the temperature of the bonding material to at least 300 degrees Celsius.

4. A method according to claim 3 wherein the heat applying step includes applying sufficient hear to raise the temperature of the bonding material to at least 350 degrees Celsius.

5. A method according to claim 3 wherein the heat applying step includes applying sufficient heat to raise the temperature of the bonding material to at least 450 degrees Celsius.

6. A method according to claim 3 wherein the heat applying step includes applying sufficient heat to raise the temperature of the bonding material to at least 500 degrees Celsius.

7. A method according to claim 1 wherein the force is at least 50000 Kg of force per cumulative gram of bonding material.

8. A method according to claim 1 wherein the force is at least 100000 Kg of force per cumulative gram of bonding material.

9. A method according to claim 1 wherein the one or more bonding regions of the die include a metallic surface of gold.

10. A method according to claim 9 wherein the one or more bonding regions of the substrate include a metallic surface of gold.

11. A method according to claim 10 wherein the bonding material includes gold.

12. A method according to claim 1 wherein the one or more bonding regions of the die include a metallic surface of aluminum.

13. A method according to claim 12 wherein the one or more bonding regions of the substrate include a metallic surface of aluminum.

14. A method according to claim 13 wherein the bonding material includes aluminum.

15. A method according to claim 1 wherein the die includes a micro-electromechanical system (MEMS) device.

16. A method according to claim 1 wherein the substrate is at least part of a device package.

17. A method according to claim 16 wherein the device package is a Lead-Less Chip Carrier (LCC) package.

18. A method according to claim 1 wherein the bonding material is provided as a number of bumps, wherein at least selected bumps include less than 0.001 grams of bonding material.

19. A method according to claim 18 wherein at least selected bumps include less than 0.0001 grams of bonding material.

20. A method according to claim 18 wherein at least selected bumps include less than 0.00005 grams of bonding material.

21. A method according to claim 1 wherein at least selected bumps have a lateral dimension before the force applying step of less than 10 mils.

22. A method according to claim 1 wherein at least selected bumps have a lateral dimension before the force applying step of less than 5 mils.

23. A method according to claim 1 wherein at least selected bumps have a lateral dimension before the force applying step of less than 3 mils.

24. A method according to claim 1 wherein the bonding material is metallic.

25. A method for bonding a die to a substrate, wherein the die includes one or more bonding regions each including a metallic surface, and wherein the substrate includes one or more bonding regions each including a metallic surface, the one or more bonding regions of the die being in registration with the one or more bonding regions of the substrate when the die is aligned with the substrate, the method comprising:

providing a bonding material on at least selected bonding regions of the die and/or substrate, wherein the bonding material in at least selected bonding regions has a minimum lateral dimension;

aligning the die and/or substrate so that the one or more bonding regions of the die are in registration with the one or more bonding regions of the substrate; and applying a force between the die and substrate that is sufficient to increase the minimum lateral dimension in at least selected bonding regions by at least 40%.

26. A method according to claim 25 wherein the applied force is sufficient to increase the minimum lateral dimension in at least selected bonding regions by at least 70%.

27. A method according to claim 25 wherein the applied force is sufficient to increase the minimum lateral dimension in at least selected bonding regions by at least 100%.

28. A method according to claim 25 wherein the applied force is sufficient to increase the minimum lateral dimension in at least selected bonding regions by a range of 40 to 300%.

29. A method according to claim 25 wherein the applied force is sufficient to increase the minimum lateral dimension in at least selected bonding regions by a range of 40 to 200%.

30. A method according to claim 25 wherein the applied force is sufficient to increase the minimum lateral dimension in at least selected bonding regions by a range of 75 to 150%.

31. A method according to claim 25 further comprising the step of applying heat to the die and/or substrate while applying the force between the die and substrate.

32. A method according to claim 31 wherein the heat applying step includes applying sufficient heat to raise the temperature of the bonding material to at least 300 degrees Celsius.

33. A method according to claim 32 wherein the heat applying step includes applying sufficient heat to raise the temperature of the bonding material to at least 350 degrees Celsius.

34. A method according to claim 32 wherein the heat applying step includes applying sufficient heat to raise the temperature of the bonding material to at least 450 degrees Celsius.

35. A method according to claim 32 wherein the heat applying step includes applying sufficient heat in raise the temperature of the bonding material to at least 500 degrees Celsius.

36. A method according to claim 25 wherein the force is at least 50000 Kg of force per gram of bonding material.

37. A method according to claim 25 wherein the force is at least 100000 Kg of force per gram of bonding material.

38. A method according to claim 1 wherein the one or more bonding regions of the die include a metallic surface of gold.

39. A method according to claim 38 wherein the one or more bonding regions of the substrate include a metallic surface of gold.

40. A method according to claim 39 wherein the bonding material includes gold.

41. A method according to claim 25 wherein the one or more bonding regions of the die include a metallic surface of aluminum.

42. A method according to claim 41 wherein the one or more bonding regions of the substrate include a metallic surface of aluminum.

43. A method according to claim 42 wherein the bonding material includes aluminum.

44. A method according to claim 25 wherein the die includes a micro-electromechanical system (MEMS) device.

45. A method according to claim 25 wherein the substrate is at least part of a device package.

46. A method according to claim 45 wherein the device package is a Lead-Less Chip Carrier (LCC) package.

47. A method according to claim 25 wherein at least selected bonding regions include less than 0.001 grams of bonding material.

48. A method according to claim 47 wherein at least selected bonding regions include less than 0,0001 grams of bonding material.

49. A method according to claim 47 wherein at least selected bonding regions include less than 0.00005 grams of bonding material.

50. A method according to claim 25 wherein the bonding material in at least selected bonding regions has a minimum lateral dimension of less than 10 mils.

51. A method according to claim 25 wherein the bonding material in at least selected bonding regions has a minimum lateral dimension of less than 5 mils.

52. A method according to claim 25 wherein the bonding material in at least selected bonding regions has a minimum lateral dimension of less than 3 mils.

53. A method according to claim 25 wherein the bonding material is metallic.

54. A method for bonding a die to a substrate, wherein the die includes one or more bonding regions each including a metallic surface, and wherein the substrate includes one or more bonding regions each including a metallic surface, the one or more bonding regions of the die being in registration with the one or more bonding regions of the substrate when the die is aligned with the substrate, the method comprising:
providing a bonding material on at least selected bonding regions of the die and/or substrate, resulting in a cumulative amount of bonding material used for bonding the die to the substrate;
aligning the die and/or substrate so that the one or more bonding regions of the die are in registration with the one or more bonding regions of the substrate;
heating the die and/or substrate to a temperature; and
applying a force between the die and substrate to form a bond, wherein the temperature and force are such that at least 75,000 kg of force per gram of cumulative bonding material is required to pull the die from the substrate.

55. A method according to claim 54 wherein the hearing step includes applying sufficient heat to raise the temperature of the bonding material to at least 300 degrees Celsius.

56. A method according to claim 55 wherein the heating step includes applying sufficient heat to raise the temperature of the bonding material to at least 350 degrees Celsius.

57. A method according to claim 55 wherein the heating step includes applying sufficient hear to raise the temperature of the bonding material to at least 450 degrees Celsius.

58. A method according to claim 55 wherein the heat applying step includes applying sufficient heat to raise the temperature of the bonding material to at least 500 degrees Celsius.

59. A method according to claim 55 wherein the force is at least 25000 Kg of force per cumulative gram of bonding material.

60. A method according to claim 59 wherein the force is at least 50000 Kg of force per cumulative gram of bonding material.

61. A method according to claim 59 wherein the force is at least 100000 Kg of force per cumulative gram of bonding material.

* * * * *

UNITED STATES PATENT AND TRADEMARK OFFICE
CERTIFICATE OF CORRECTION

PATENT NO. : 7,037,805 B2 Page 1 of 1
APPLICATION NO. : 10/878845
DATED : May 2, 2006
INVENTOR(S) : Jon B. DCamp et al.

It is certified that error appears in the above-identified patent and that said Letters Patent is hereby corrected as shown below:

In the drawings, Sheet 8, Fig. 10, delete reference number "602" applied to the tool holder engaged with the proximal end 610 of the tool 604, replace with reference number -- 601 --

Col 4, line 64, delete "Micro-machine 110", replace with -- Micro-machine 108 --
Col 6, line 26, insert --that-- after "subtrate"
Col 7, line 61, delete "tool holder 602", replace with -- tool holder 601 --
Col 7, line 62, delete "tool holder 602", replace with -- tool holder 601 --
Col 8, line 4, delete "tool 602", replace with -- tool 604 --
Col 8, line 22, delete "distal end 603", replace with -- distal end 620 --
Col 8, line 30, delete "distal end 603", replace with -- distal end 620 --
Col 8, line 35, delete "to", replace with -- so --
Col 9, line 2, delete "hear", replace with -- heat --
Col 10, line 14, delete "clalm", replace with -- claim --
Col 10, line 19, delete "40to", replace with -- 40 to --
Col 10, line 22, delete "40to", replace with -- 40 to --
Col 10, line 25, delete "75to", replace with -- 75 to --
Col 11, line 9, delete "0,0001", replace with -- 0.0001 --
Col 12, line 11, delete "hearing", replace with -- heating --
Col 12, line 18, delete "hear", replace with -- heat --

Signed and Sealed this

Ninth Day of January, 2007

JON W. DUDAS
*Director of the United States Patent and Trademark Office*